US008875373B2

(12) United States Patent
Lee

(10) Patent No.: US 8,875,373 B2
(45) Date of Patent: Nov. 4, 2014

(54) MANUFACTURING METHOD OF A HEAT CONDUCTIVE DEVICE FOR A LIGHT-EMITTING DIODE

(75) Inventor: Tsu Lee, Taipei (TW)

(73) Assignee: Pan-Jit International Inc., Kaohsiung (TW)

( * ) Notice: Subject to any disclaimer, the term of this patent is extended or adjusted under 35 U.S.C. 154(b) by 675 days.

(21) Appl. No.: 13/234,370

(22) Filed: Sep. 16, 2011

(65) Prior Publication Data

US 2012/0311849 A1    Dec. 13, 2012

(30) Foreign Application Priority Data

Jun. 10, 2011    (TW) .............................. 100120274 A

(51) Int. Cl.
| | |
|---|---|
| *B23P 11/02* | (2006.01) |
| *F21K 99/00* | (2010.01) |
| *F21V 19/00* | (2006.01) |
| *H05K 7/20* | (2006.01) |
| *F21V 29/00* | (2006.01) |
| *F21Y 101/02* | (2006.01) |
| *H01C 1/084* | (2006.01) |

(52) U.S. Cl.
CPC ............. *F21V 19/004* (2013.01); *F21K 9/1375* (2013.01); *F21V 19/005* (2013.01); *F21V 29/262* (2013.01); *F21K 9/30* (2013.01); *F28F 2275/127* (2013.01); *F21V 29/22* (2013.01); *F21K 9/90* (2013.01); *F21Y 2101/02* (2013.01); *H01C 1/084* (2013.01); *H05K 7/20* (2013.01)
USPC ................... 29/447; 29/428; 29/832; 29/840; 362/294; 362/373; 372/36; 257/676; 228/127; 228/136; 228/179.1; 165/80.2; 165/80.3

(58) Field of Classification Search
CPC ............. F21K 9/90; F21K 9/30; F21V 29/22; F21V 29/2293; F21V 29/262; F21V 19/004; F21V 19/005; F21V 19/001; F21V 19/0035; F28F 2275/127; H10C 1/084; H05K 7/20
USPC ................... 29/447, 428, 830, 831, 832, 840; 362/294, 373; 367/36; 257/676, 675; 228/127, 128, 136, 179.1; 165/80.2, 165/80.3
See application file for complete search history.

(56) References Cited

U.S. PATENT DOCUMENTS

| | | | |
|---|---|---|---|
| 7,646,544 B2 * | 1/2010 | Batchko et al. ................ | 359/665 |
| 7,816,698 B2 * | 10/2010 | Lin ................................. | 257/98 |
| 8,362,509 B2 * | 1/2013 | Pickard et al. .................. | 257/98 |

(Continued)

*Primary Examiner* — Peter DungBa Vo
*Assistant Examiner* — Jeffrey T Carley
(74) *Attorney, Agent, or Firm* — Rabin & Berdo, P.C.

(57) ABSTRACT

A manufacturing method of heat conductive device for an LED has steps of forming a heat sink and an engagement recess in the heat sink by cold forge, punching a heat-conducting disc to form an LED carrier having a mounting portion and a heat-conducting wall formed around the mounting portion, soldering multiple LEDs on the LED carrier, and heating the heat sink to thermally expand the heat sink and assembling the LED carrier and the heat sink so that the heat-conducting wall is assembled with the engagement recess and further chilling the heat sink to thermally retract and tightly hold the LED carrier. The manufacturing method increases contact area and reduces air gaps between the LED carrier and the heat sink to effectively enhance the heat-conducting efficiency of the LED carrier so that the LEDs are operated at a suitable operating temperature to secure a prolonged life duration.

6 Claims, 6 Drawing Sheets

(56) References Cited

U.S. PATENT DOCUMENTS

| | | | |
|---|---|---|---|
| 8,476,812 B2* | 7/2013 | Chan et al. ..................... 313/45 |
| 8,608,341 B2* | 12/2013 | Boomgaarden et al. . 362/249.02 |
| 2009/0237932 A1* | 9/2009 | Lee .......................... 362/249.02 |
| 2010/0132931 A1* | 6/2010 | Liaw et al. .................... 165/185 |
| 2011/0006658 A1* | 1/2011 | Chan et al. ..................... 313/45 |
| 2011/0095690 A1* | 4/2011 | Sagal ............................ 315/113 |
| 2012/0195043 A1* | 8/2012 | Watanabe et al. ........ 362/249.02 |

* cited by examiner

MANUFACTURING METHOD OF A HEAT CONDUCTIVE DEVICE FOR A LIGHT-EMITTING DIODE

BACKGROUND OF THE INVENTION

1. Field of the Invention

The present invention relates to a manufacturing method of a heat conductive device for a light-emitting diode (LED), and more particularly to a forming method of a heat conductive device capable of enhancing heat conduction efficiency for transferring heat generated by an LED.

2. Description of the Related Art

Currently an LED lamp has an LED carrier mounted therein, multiple light-emitting diodes mounted on the LED carrier and a heat sink adjacently connected to the LED carrier. The LED carrier has a heat-dissipating surface formed on a top surface of the LED carrier and contacting the heat sink through a thermal conductive adhesive. Heat generated by lighting the LED lamp can be transferred to a heat-dissipating surface of the heat sink through the LED carrier and the thermal conductive adhesive for the purpose of heat dissipation.

As the foregoing LED carrier only employs the single heat-conducting surface formed on the top surface of the LED carrier, the heat-conducting surface is not large enough, the heat-conducting surface and the heat sink are fastened by bolts, lots of air gaps exist between the heat-conducting surface and the heat sink and heat generated by the LED lamp fails to be effectively transferred to the heat sink for heat dissipation, thereby leading to an unsatisfactory heat-dissipating efficiency. Hence, temperature of the LED lamp increases and the LED lamp is operated at an improper working temperature. Such unfavorable temperature condition inevitably results in shorter life duration and deteriorating performance of the LED lamp.

SUMMARY OF THE INVENTION

An objective of the present invention is to provide a forming method of a heat conductive device capable of enhancing heat conduction efficiency for transferring heat generated by an LED.

To achieve the foregoing objective, the manufacturing method of heat conductive device for an LED comprising steps of:

manufacturing a heat sink by cold forge forming and forming an engagement recess in the heat sink;

placing a heat-conducting disc in a die and punching the heat-conducting disc to form a mounting portion and a heat-conducting wall of an LED carrier, wherein the heat-conducting wall is formed along and protrudes from a perimeter of the mounting portion;

positioning and soldering multiple light-emitting diodes on a side of the mounting portion surrounded by the heat-conducting wall; and heating the heat sink to thermally expand the heat sink and assembling the LED carrier and the heat sink so that the heat-conducting wall of the LED carrier is assembled with the engagement recess of the heat sink and chilling the heat sink to thermally retract and tightly hold the LED carrier.

Cold forge forming serves to increase material density and thus enhances heat conduction of the processed material. In the punching step of the manufacturing method, the conical heat-conducting wall is formed on and protrudes from the perimeter of the mounting area of the LED carrier to increase heat-conducting area of the LED carrier. In the assembling step with a tight fit, the LED carrier can be tightly mounted in the heat sink so that the conical heat-conducting wall and the heat sink contact each other. During the step of assembling the LED carrier and the heat sink, heating the LED carrier first and then chilling the heat sink can increase the tightness therebetween. Heat generated from the LEDs and conducted to the LED carrier can be more effectively transferred to the heat sink and the heat conduction efficiency of the LED carrier is improved. Therefore, the LEDs on the LED carrier can be operated at a suitable operating temperature to secure a prolonged life duration thereof and the method is beneficial to industry application for eliminating the use of heat conductive adhesive and bolts.

Other objectives, advantages and novel features of the invention will become more apparent from the following detailed description when taken in conjunction with the accompanying drawings.

DETAILED DESCRIPTION OF THE INVENTION

Figure 1:
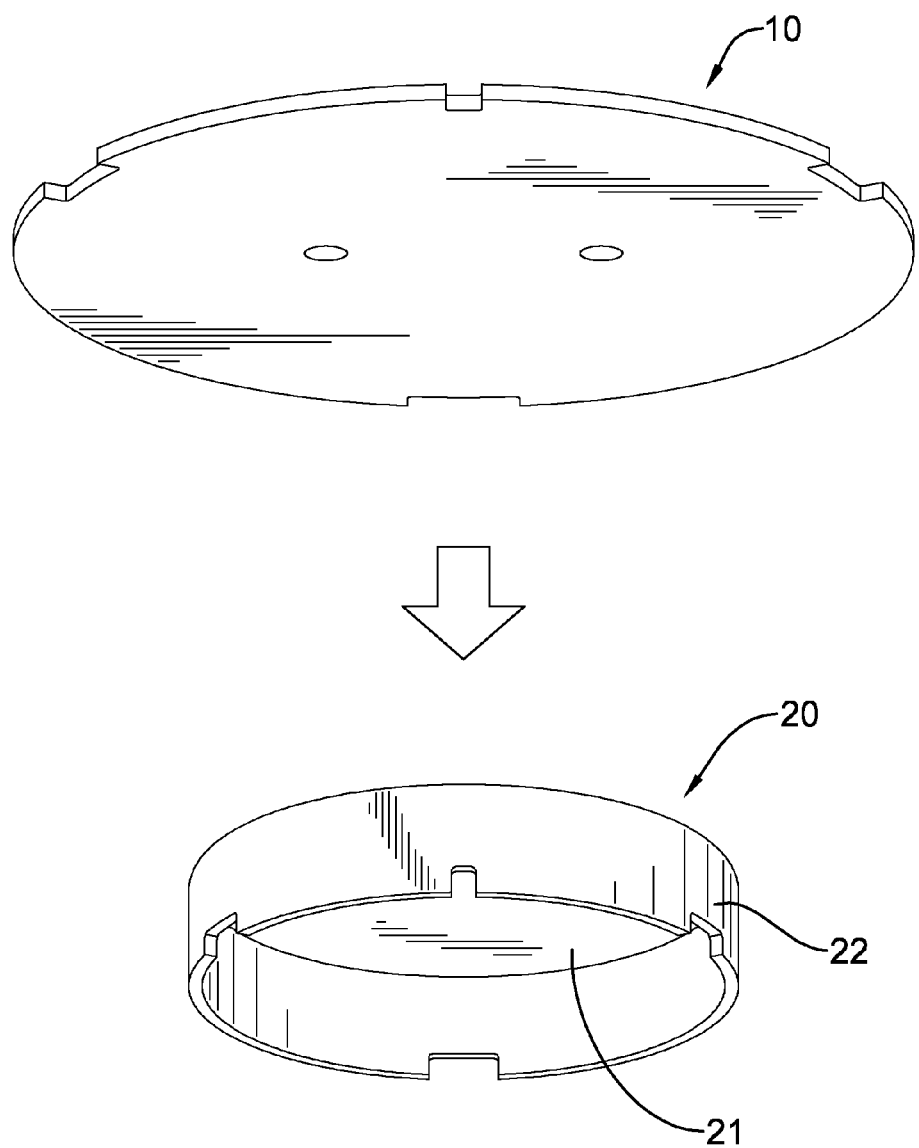
FIG. 1 is a partial perspective view of a heat conductive device for an LED formed by a manufacturing method in accordance with the present invention.
Figure 2:
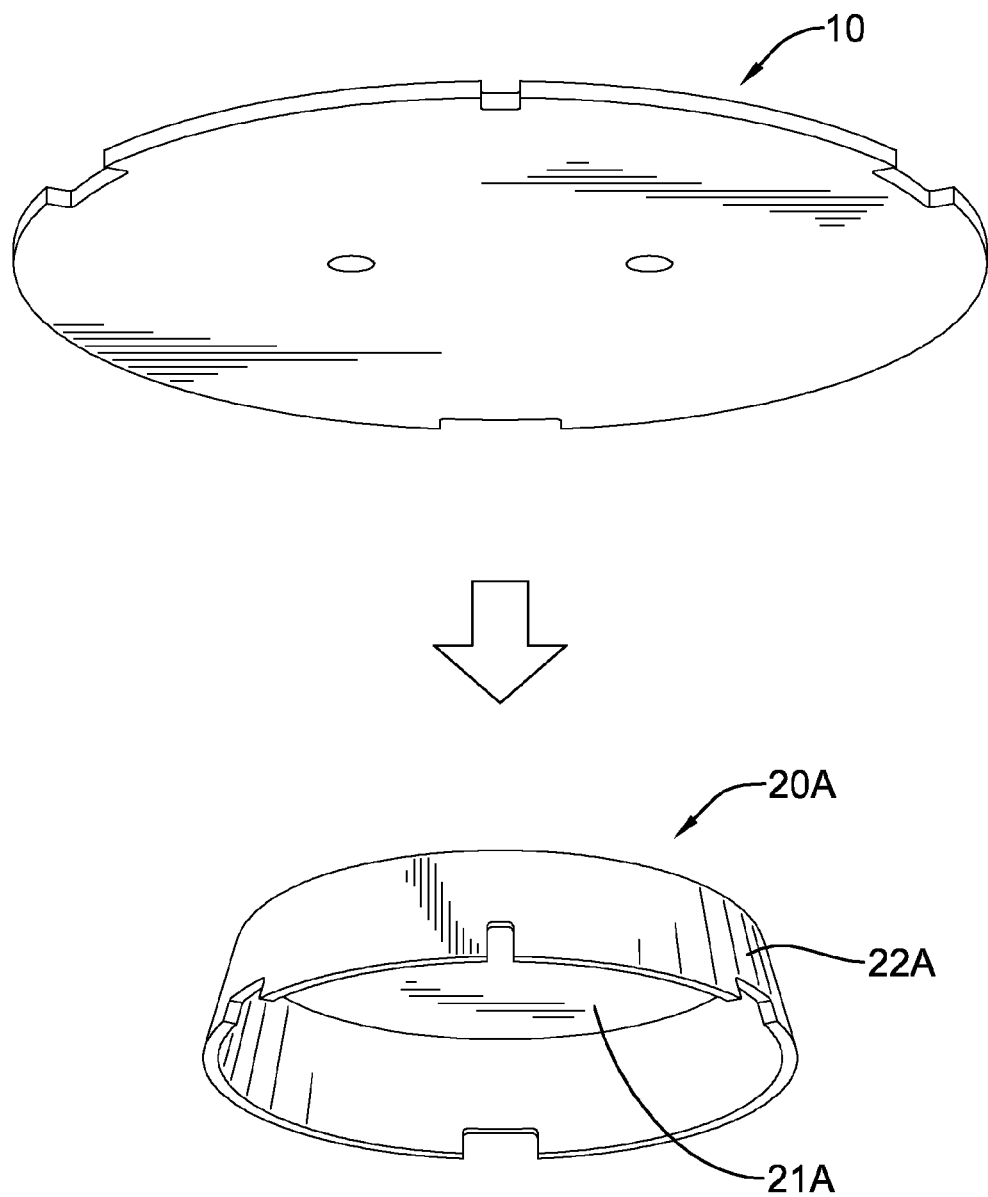
FIG. 2 is a partial perspective view of another heat conductive device for an LED formed by the manufacturing method in FIG. 1.

With reference to FIGS. 1 to 5, a heat conductive device for an LED formed by a manufacturing method in accordance with the present invention has a heat sink 30 and an LED carrier 20, 20A. The heat sink 30 has a cylindrical or conical engagement recess formed therein. The LED carrier 20, 20A engages the heat sink 30, is mounted in the heat sink 30, and has a mounting portion 21, 21A and a heat-conducting wall 22, 22A. The mounting portion 21, 21A is circular in shape. The heat-conducting wall 22, 22A is perpendicularly and conically formed along and protrudes from a perimeter of the mounting portion 21, 21A as respectively shown in FIGS. 1 and 2. An outer diameter of the heat-conducting wall 22, 22A is larger than a diameter of the mounting portion 21, 21A.

The manufacturing method has the following steps.

1) Manufacture the heat sink 30 by cold forge forming and form the engagement recess in the heat sink 30.

2) Place a heat-conducting disc 10 in a die and punch the heat-conducting disc 10 to form the mounting portion 21, 21A and the heat-conducting wall 22, 22A of the LED carrier 20.

3) Position and solder multiple LEDs 40 on a side of the mounting portion 21, 21A surrounded by the heat-conducting wall 22, 22A.

Figure 3:
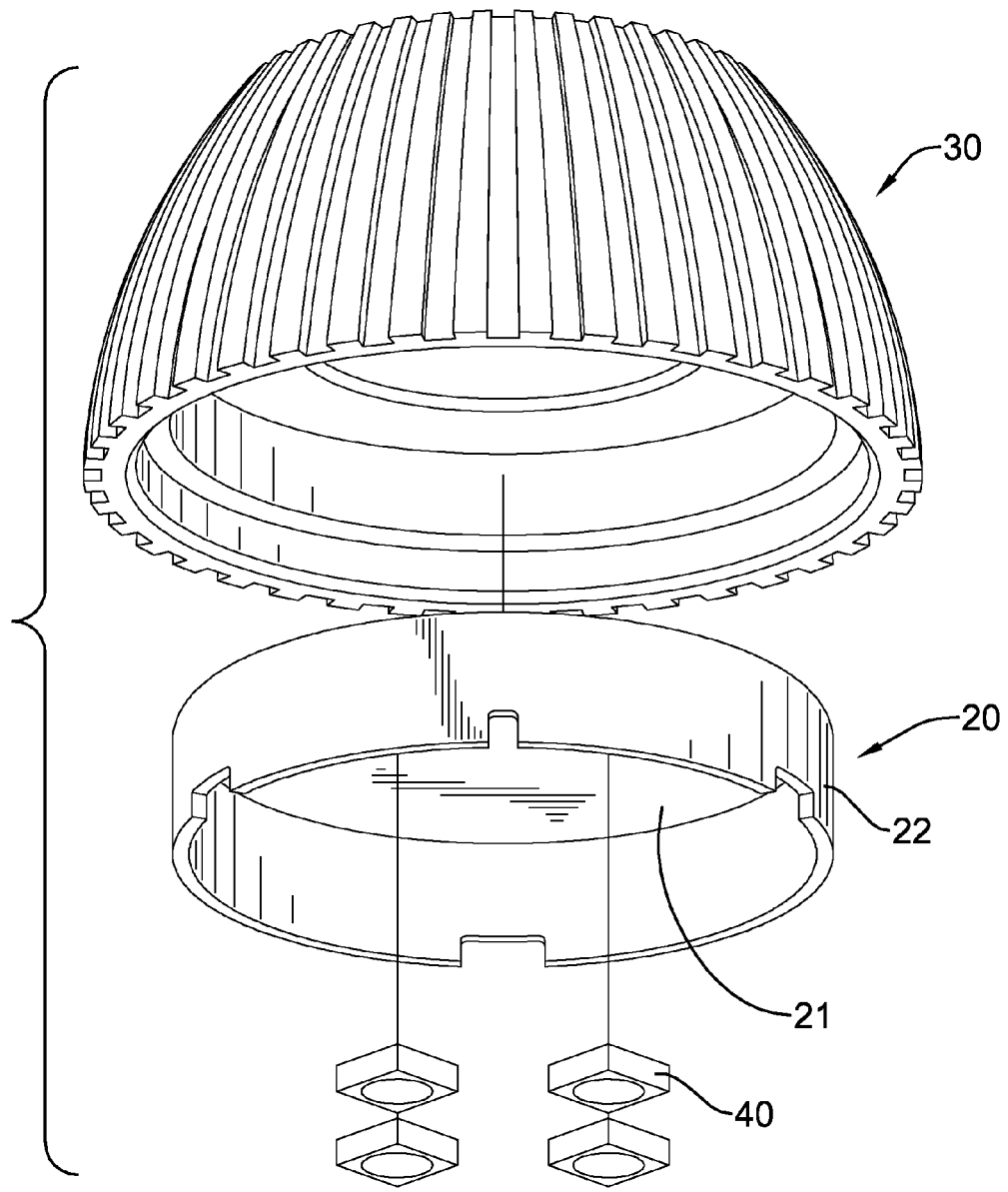
FIG. 3 is an exploded perspective view of the heat conductive device for an LED in FIG. 1.
Figure 4:
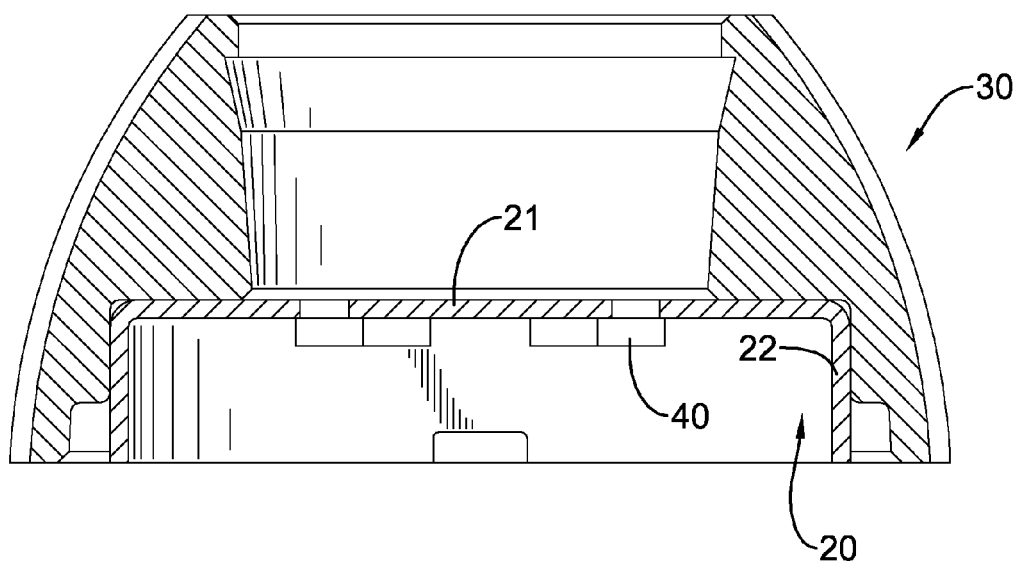
FIG. 4 is a side view in partial section of the heat conductive device for an LED in FIG. 1.
Figure 5:
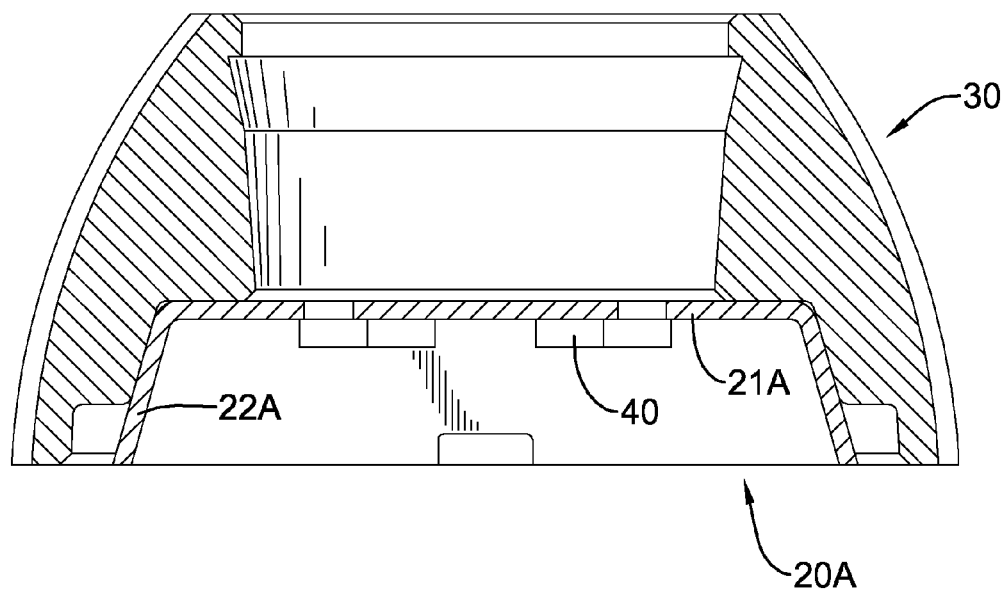
FIG. 5 is a side view in partial section of the heat conductive device for an LED in FIG. 2.

4) Place the LED carrier 20, 20A and the heat sink 30 in corresponding assembly dies. Heat the heat sink 30 to thermally expand the heat sink 30. Use a hydraulic device connected to the assembly dies to assemble the LED carrier 20, 20A and the heat sink 30 so that part of the mounting portion 21, 21A and the heat-conducting wall 22, 22A of the LED carrier 20, 20A are assembled with the engagement recess of the heat sink 30 as shown in FIGS. 3 to 5. Chill the heat sink 30 to thermally retract and tightly hold the LED carrier 20, 20A to increase tightness and reduce air gaps therebetween.

Figure 6:
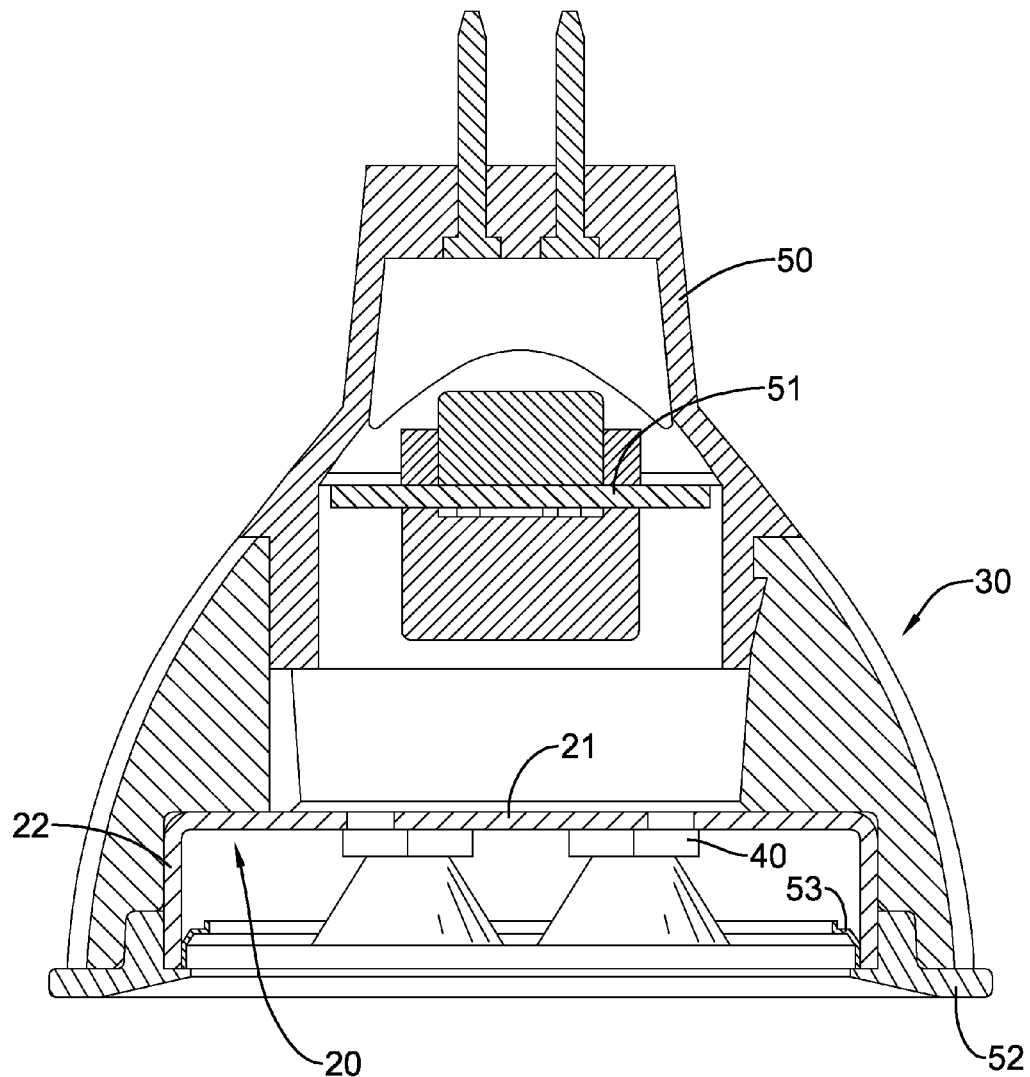
FIG. 6 is a side view in partial section of an LED lamp having the heat conductive device in FIG. 1 mounted therein.

With reference to FIG. 6, the assembled LED carrier 20 and the heat sink 30 form a heat conductive device for an LED. The heat conductive device for an LED can be mounted in an LED lamp. The LED lamp further has a lamp seat 50, a light cup unit 53 and a positioning element 52. The lamp seat 50 is mounted on the heat sink 30 and has a control module 51 mounted therein. The LEDs 40 are electrically connected with the control module 51. The light cup unit 53 is adjacent to the LED carrier 20 and is mounted in collaboration with the LEDs 40. The light cup unit 53 is positioned on the heat sink 30 by the positioning element 52. Heat generated by operating the LEDs 40 is conducted to the mounting portion 21 and the heat-conducting wall 22 of the LED carrier 20 first and is further conducted to the heat sink 30 for heat dissipation.

In sum, the manufacturing method of heat conductive device for an LED forms the heat sink 30 having a higher material density due to a cold forging process and facilitating heat conduction, increases the contact area between the LED carrier 20, 20A and the heat sink 30, employs a tight fit to engage the heat-conducting wall 22, 22A of the LED carrier 20, 20A and the engagement recess of the heat sink 30 and reduces air gaps between the LED carrier 20, 20A and the heat sink 30 by heating the LED carrier 20, 20A and chilling the heat sink 30. Accordingly, heat generated from the LEDs 40 and conducted to the LED carrier 20 can be more effectively transferred to the heat sink 30 to improve the heat conduction efficiency of the LED carrier 20, 20A so that the LEDs 40 on the LED carrier 20 can be operated at a suitable operating temperature to secure a prolonged life duration of the LEDs 40 and the manufacturing method is beneficial to industry application for eliminating the use of heat conductive adhesive and bolts.

Even though numerous characteristics and advantages of the present invention have been set forth in the foregoing description, together with details of the structure and function of the invention, the disclosure is illustrative only. Changes may be made in detail, especially in matters of shape, size, and arrangement of parts within the principles of the invention to the full extent indicated by the broad general meaning of the terms in which the appended claims are expressed.

What is claimed is:

1. A manufacturing method of heat conductive device for an LED comprising steps of:
    manufacturing a heat sink by cold forge forming and forming an engagement recess in the heat sink;
    placing a heat-conducting disc in a die and punching the heat-conducting disc to form a mounting portion and a heat-conducting wall of an LED carrier, wherein the heat-conducting wall is formed along and protrudes from a perimeter of the mounting portion;
    positioning and soldering multiple light-emitting diodes on a side of the mounting portion surrounded by the heat-conducting wall; and
    heating the heat sink to thermally expand the heat sink and assembling the LED carrier and the heat sink so that the heat-conducting wall of the LED carrier is assembled with the engagement recess of the heat sink and chilling the heat sink to thermally retract and tightly hold the LED carrier.

2. The manufacturing method as claimed in claim 1, wherein
    the engagement recess of the heat sink is conical; and
    the heat-conducting wall is conically formed along and protrudes from a perimeter of the mounting portion of the LED carrier, is mounted in the heat sink and engages the engagement recess of the heat sink by tight fit.

3. The manufacturing method as claimed in claim 1, wherein
    the engagement recess of the heat sink is cylindrical; and
    the heat-conducting wall is perpendicularly formed along and protrudes from a perimeter of the mounting portion of the LED carrier, is mounted in the heat sink and engages the engagement recess of the heat sink by tight fit.

4. The manufacturing method as claimed in claim 1, wherein an outer diameter of the heat-conducting wall is larger than a diameter of the mounting portion.

5. The manufacturing method as claimed in claim 2, wherein an outer diameter of the heat-conducting wall is larger than a diameter of the mounting portion.

6. The manufacturing method as claimed in claim 3, wherein an outer diameter of the heat-conducting wall is larger than a diameter of the mounting portion.

* * * * *